(12) United States Patent
Tanadi

(10) Patent No.: US 9,785,171 B2
(45) Date of Patent: Oct. 10, 2017

(54) APPARATUSES AND RELATED METHODS FOR STAGGERING POWER-UP OF A STACK OF SEMICONDUCTOR DIES

(71) Applicant: Micron Technology, Inc., Boise, ID (US)

(72) Inventor: Trismardawi Tanadi, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/086,763

(22) Filed: Mar. 31, 2016

(65) Prior Publication Data
US 2016/0209859 A1 Jul. 21, 2016

Related U.S. Application Data

(62) Division of application No. 14/020,549, filed on Sep. 6, 2013, now Pat. No. 9,305,905.

(51) Int. Cl.
| | |
|---|---|
| *H03L 7/00* | (2006.01) |
| *G05F 1/66* | (2006.01) |
| *H01L 25/11* | (2006.01) |
| *H01L 25/10* | (2006.01) |
| *H01L 25/065* | (2006.01) |
| *H03K 5/14* | (2014.01) |
| *H03K 17/22* | (2006.01) |
| *G06F 1/26* | (2006.01) |
| *H03K 5/00* | (2006.01) |

(52) U.S. Cl.
CPC ............ *G05F 1/66* (2013.01); *H01L 25/0657* (2013.01); *H01L 25/105* (2013.01); *H01L 25/117* (2013.01); *H03K 5/14* (2013.01); *H03K 17/223* (2013.01); *G06F 1/26* (2013.01); *H01L 2924/0002* (2013.01); *H03K 2005/00234* (2013.01)

(58) Field of Classification Search
CPC .......... G05F 1/66; H03K 5/14; H03K 17/223; H01L 25/105; H01L 25/106; H01L 25/117; H01L 25/0625
USPC .......................................................... 327/143
See application file for complete search history.

(56) References Cited

U.S. PATENT DOCUMENTS

| | | |
|---|---|---|
| 5,323,060 A | 6/1994 | Fogal et al. |
| 5,721,452 A | 2/1998 | Fogal et al. |
| 5,815,372 A | 9/1998 | Gallas |
| 5,898,220 A | 4/1999 | Ball |

(Continued)

OTHER PUBLICATIONS

Micron, Technical Note, NAND Flash 101: An Introduction to NAND Flash and How to Design it in to Your Next Product, TN-29-19: NAND Flash 101 Introduction, (2006), 27 pages.

(Continued)

*Primary Examiner* — Ryan Jager
(74) *Attorney, Agent, or Firm* — TraskBritt

(57) ABSTRACT

An apparatus including semiconductor dies in a stack. The semiconductor dies are configured to power-up in a staggered manner. Methods for powering up an electronic device include detecting a power-up event with the semiconductor dies in the stack, and responsive to the power-up event, powering up a first semiconductor die in the stack at a first time, and powering up a second semiconductor die in the stack at a second time that is different from the first time.

14 Claims, 10 Drawing Sheets

(56) References Cited

U.S. PATENT DOCUMENTS

| | | | |
|---|---|---|---|
| 6,603,072 B1 | 8/2003 | Foster et al. | |
| 7,608,924 B2 | 10/2009 | Myers et al. | |
| 8,112,564 B2 | 2/2012 | Duerk et al. | |
| 2009/0027939 A1* | 1/2009 | Kang | G11C 7/20 |
| | | | 365/51 |
| 2010/0244912 A1* | 9/2010 | Chen | H03K 17/22 |
| | | | 327/143 |
| 2010/0302891 A1* | 12/2010 | Wang | G11C 5/14 |
| | | | 365/226 |
| 2011/0161561 A1 | 6/2011 | Tsai et al. | |
| 2011/0271036 A1* | 11/2011 | Cheng | G06F 1/24 |
| | | | 711/103 |
| 2012/0049354 A1* | 3/2012 | Sawayama | H01L 21/561 |
| | | | 257/737 |
| 2012/0226919 A1* | 9/2012 | Pellach | G06F 1/26 |
| | | | 713/300 |
| 2012/0320680 A1* | 12/2012 | Sundahl | G11C 16/30 |
| | | | 365/185.18 |
| 2012/0327688 A1 | 12/2012 | Guthrie et al. | |
| 2015/0048869 A1* | 2/2015 | Huang | H03K 17/223 |
| | | | 327/143 |
| 2015/0070056 A1 | 3/2015 | Tanadi | |

OTHER PUBLICATIONS

Micron, Micron Parallel NOR Flash Embedded Memory (P30-65nm), 256Mb and 512Mb (256Mb/256Mb), P30-65nm Features, (2013), 95 pages.

\* cited by examiner

APPARATUSES AND RELATED METHODS FOR STAGGERING POWER-UP OF A STACK OF SEMICONDUCTOR DIES

CROSS-REFERENCE TO RELATED APPLICATION

This application is a divisional of U.S. patent application Ser. No. 14/020,549, filed Sep. 6, 2013, now U.S. Pat. No. 9,305,905, issued Apr. 5, 2016, the disclosure of which is hereby incorporated herein in its entirety by this reference.

FIELD

Embodiments of the present disclosure relate to powering up a stack of semiconductor dies. More particularly, the present disclosure relates to staggering power-up of a stack of semiconductor dies.

BACKGROUND

Integrated circuits perform a variety of functions, spanning a variety of applications. Conventional integrated circuits typically include a semiconductor die, sometimes with thousands, millions, or even billions of circuit components, encased in a package, made of plastic or ceramic materials. The semiconductor die is operably coupled to one or more electrically conductive contacts that extend out of the package to enable electrical communication between the semiconductor die and external electronic devices, often through a printed circuit board (PCB).

The demand for higher-density integrated circuits has driven the semiconductor industry to manufacture semiconductor dies with smaller and smaller circuit components. In addition, in order to keep pace with the demand for higher-density integrated circuits, some manufacturers have begun stacking semiconductor dies. During conventional power-up of stacked semiconductor dies, each die of the stack is powered up concurrently, which may result in drawing a relatively large peak current during power-up. In addition, voltage transients may be relatively large, which may lead to improper powering up of the die stack as a whole. Also, conventional semiconductor dies may monitor a power supply voltage, and reset if the magnitude of the power supply voltage drops below a reset threshold. In such semiconductor dies, the voltage transients at power-up may be large enough to cause the power supply voltage to drop below the reset thresholds for the semiconductor dies, which may result in a repeating cycle of attempted power-up and reset.

DETAILED DESCRIPTION

Figure 1:
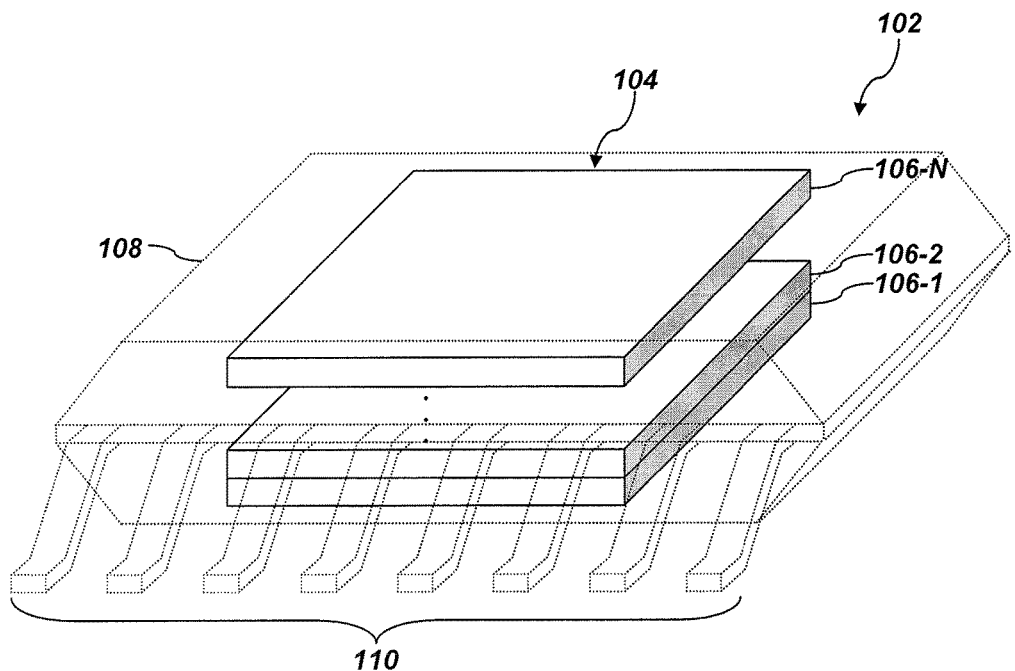
FIG. 1 a simplified perspective view of an electronic device including a stack of semiconductor dies in a package.

In the following detailed description, reference is made to the accompanying drawings that form a part hereof, and in which is shown by way of illustration, specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions, rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware, software, or a combination thereof, depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions (e.g., software code) on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1).

Embodiments of the present disclosure include systems, methods, and devices for staggering power-up of a plurality of semiconductor dies arranged in a stack over time. As discussed above, integrated circuits span a variety of functions in a variety of applications. Embodiments of the present disclosure are generally described herein with reference to memory devices. It should be noted, however, that embodiments of the present disclosure may include any application or environment where staggering initiation of power of stacked semiconductor dies is desirable. For example, it is contemplated that embodiments of the present disclosure may include staggering initiation of power in a stack of semiconductor dies including processor circuitry.

The term "semiconductor die" refers to a segment of semiconductor material upon or in which at least one functional electronic device is fabricated.

The term "package" refers to a housing for one or more semiconductor die.

The term "pin" refers to a conductive structure that extends from a package, and is operably coupled (e.g., electrically connected) to the semiconductor die or semiconductor dies housed in a package. The term "pin" may refer to pins, pads, "gull wing" leads, solder balls, other electrically conductive structures, and combinations thereof.

The term "stack" refers to two or more semiconductor dies displaced from each other vertically, horizontally, and combinations thereof. Semiconductor dies in a stack that are vertically displaced from each other may sometimes at least partially horizontally overlap each other. Although the term "stack" encompasses two or more semiconductor dies that are centered horizontally with respect to each other, a limitation of the semiconductor dies having such an alignment is not necessarily implied herein, unless otherwise explicitly indicated. Horizontal displacement may include two or more semiconductor dies that are side by side.

Embodiments of the present disclosure include an apparatus including a first semiconductor die having at least one power input, and a second semiconductor die having at least a second power input operably coupled to the at least one power input. The first semiconductor die and the second semiconductor die may form a stack, which may be housed by a common package. Responsive to a power-up event, the first semiconductor die is configured to power up at a first time, and the second semiconductor die is configured to power up at a second time that is different from the first time. In other words, the first semiconductor die is configured to initiate power-up at a first time, and the second semiconductor die is configured to initiate power-up at a second time that is different from the first time.

FIG. 1 is a simplified perspective view of an electronic device 102 including a stack 104 of semiconductor dies 106-1, 106-2, . . . 106-N (sometimes referred to herein generally together as "dies 106," and alone as "die 106") housed within a package 108. By way of non-limiting example, the stack 104 may include two, three, four, or more dies 106. The package 108 may include a plurality of electrically conductive pins 110 (sometimes referred to herein generally in the singular as "pin 110," and in the plural as "pins 110") operably coupled to one or more of the dies 106 in the stack 104.

At least one functional electronic device may be fabricated in the substrate of each die 106. For purposes of this disclosure, being fabricated in a substrate should be interpreted as "on or in" the substrate. By way of non-limiting example, each die 106 may include an electronic circuit, such as a memory device, a processor, a digital circuit, an analog circuit, etc. A memory device, may include a random access memory (RAM) device. In some embodiments, electrically conductive structures (not shown) may extend between dies 106 within the stack 104, operably coupling the dies 106 to each other.

Each die 106 may comprise a semiconductor material having any of a variety of shapes and sizes, including, but not limited to, a substantially flat rectangular, circular, elliptical, and square. In some embodiments, each of the dies 106 may have the same shape and size. In some embodiments, one or more of the dies 106 may take a different shape, size, and combinations thereof, from at least another die 106. Also, each die 106 may comprise any of a variety of materials, including, but not limited to, IV semiconductor material (such as, for example, silicon), III-V semiconductor material (such as, for example, gallium arsenide (GaAs)), II-VI semiconductor material, other semiconductor materials, and combinations thereof. In addition, each die 106 may include a substrate. The substrate may include semiconductor material, and, in some embodiments, may be a semiconductor on insulator substrate (such as, for example, silicon on insulator (SOI), silicon on glass (SOG), or silicon on sapphire (SOS)).

The electrically conductive pins 110 may include a set of electrically conductive power pins configured to deliver power to each of the dies 106. The dies 106 may be configured to power up responsive to a power-up event. By way of non-limiting example, the power-up event may include a magnitude of a power supply voltage exceeding a predetermined threshold voltage, receipt of a power-up command by the dies 106, other events, and combinations thereof. Power-up of the dies 106 may be staggered in accordance with embodiments of the disclosure.

The term "staggered," "staggering," "stagger," and other forms of the base term "stagger," when used herein to describe power-up of the dies 106, refers to initiating power-up of at least one first die 106-1 at a first time, and initiating power-up of at least one second die 106-2 at a second time that is different from the first time. In some embodiments, the duration to complete power-up for the at least one first die 106-1 may be less than a duration between the first time and a second time when power up of the second die 106-2 is initiated. As a result, the power-up of the first die 106-1 and power-up of the second die 106-2 do not overlap. In some embodiments, the duration to complete power-up for the first die 106-1 may be substantially the same as the duration between the first time and the second time when the second die 106-2 is initiated. In other words, there is no overlap in the power-up of the first die 106-1 and the second die 106-2 because power-up of the second die 106-2 is initiated at substantially the same time as the completion of the power-up of the first die 106-1. In some embodiments, power-up of more than one die may at least partially overlap even though power-up of the dies 106 is staggered, such as in embodiments where the duration to complete power-up of the first die 106-1 is more than the duration between the first time and the second time when the second die 106-2 is initiated. Therefore, the term "stagger" does not imply that there is no overlap of a power-up duration of dies being sequentially powered up.

In some embodiments, the duration of time between the power-up event and power-up of a given die 106 may depend, at least in part, on an arrangement of conductive interconnects external to the given die 106. By way of non-limiting example, the given die 106 may be configured with a plurality of delays comprising different time durations selectable responsive to the arrangement of the conductive interconnects. Also by way of non-limiting example, the duration of time between the power-up event and power-up of the given die 106 may depend on a configuration of the interconnects operably coupling the given die 106 to another given die 106.

Some embodiments may initiate power-up of a first subset of the dies 106 at a first time, and initiate power up of a second subset of the dies 106 at a second time. Therefore, in some embodiments a plurality of dies 106 may be powered up at the same time so long as another plurality of dies 106 is powered up at a different time. Therefore, even though powering up a first die 106-1 and a second die 106-2 is described herein, the disclosure should not be interpreted as precluding additional dies being powered up at the same time that are part of the same subgroup of either the first die 106-1 or second die 106-2.

The position of the dies 106 in the stack 104 does not necessarily imply the order in which the dies 106 are configured to power up. In some embodiments, the dies 106 may power up starting with the first die 106-1 physically located at a bottom of the stack 104, and ending with a last die 106-N physically located at a top of the stack 104. In some embodiments, the dies 106 may power up starting with the last die 106-N physically located at the top of the stack 104, and ending with the first die 106-1 physically located at the bottom of the stack 104. In some embodiments, however, power up may start with any of the dies 106, and end with any other of the dies 106 in the stack 104, in any permutation of orders.

It should be recognized that FIG. 1 is intended to be a simplified view of the electronic device 102 and that many materials and interconnections are not shown, but that such materials and interconnections would be understood by those of ordinary skill in the art. In addition, stacking of dies 106 may be achieved by methods known in the art. By way of non-limiting example, methods for stacking dies in a multichip module including a multichip module substrate having a plurality of chips in a stack, and adhesive layers interposed between the chips in the stack is disclosed in U.S. Pat. No. 5,323,060 to Fogal, et al., the entire disclosure of which is incorporated herein by this reference. Other methods of stacking dies 106 are known in the art.

In some embodiments, the semiconductor dies that are not of the same stack, but are within the same package may be powered up in a staggered manner. For example, the semiconductor dies may be disposed on opposing sides of a substrate. In some embodiments, the semiconductor dies may be in different stacks on a substrate. For example, semiconductor dies of a first stack may initiate power-up at a first time and semiconductor dies of a second stack may initiate power-up at a second time that is different from the first time. The first stack and the second stack may be disposed on the same side of the substrate, or on opposing sides of the substrate.

By way of non-limiting example, the electronic device 102 may be a memory device, and each of the dies 106 may be a memory die. In such embodiments, the density of a multi-die memory device over a density of a single die 106 memory device may be doubled by stacking two dies 106, tripled by stacking three dies 106, and etc. In some embodiments, at least one of the dies 106 may be different from at least another die 106. By way of non-limiting example, each of the dies 106 may include a different component of an electronic system, such as a logic die or a processor die. In such embodiments, the electronic device 102 may be, for example, a system on chip (SOC) device.

Figure 2:
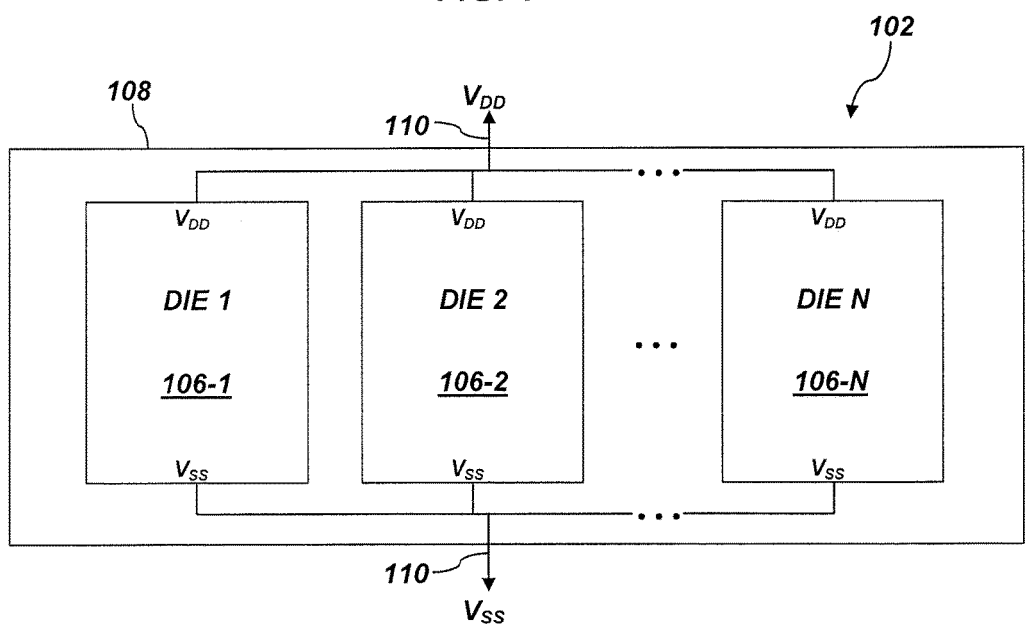
FIG. 2 is a simplified block diagram of the electronic device of FIG. 1.

FIG. 2 is a simplified block diagram of the electronic device 102 of FIG. 1. Power may be provided to each of the dies 106 through some of the plurality of pins 110 of the package 108. By way of non-limiting example, the package 108 may include a set of electrically conductive power pins 110 (shown in FIG. 2 as having voltages $V_{DD}$ and $V_{SS}$ applied thereto). In some embodiments, each of the dies 106 may be substantially identical to each other. Each die 106 may be configured to initiate power up at a different time. In other words, the electronic device 102 may be configured to stagger the power-up of the dies 106 in the stack 104. As a result, the dies 106 may exhibit a relatively lower voltage transient at the power supply than relatively higher voltage transients that may otherwise result from a current required for powering up all the dies 106 concurrently. Such relatively higher voltage transients may cause the power supply voltage to drop out of a functional range for the dies 106, resulting in improper functioning of the dies 106.

Figure 3:
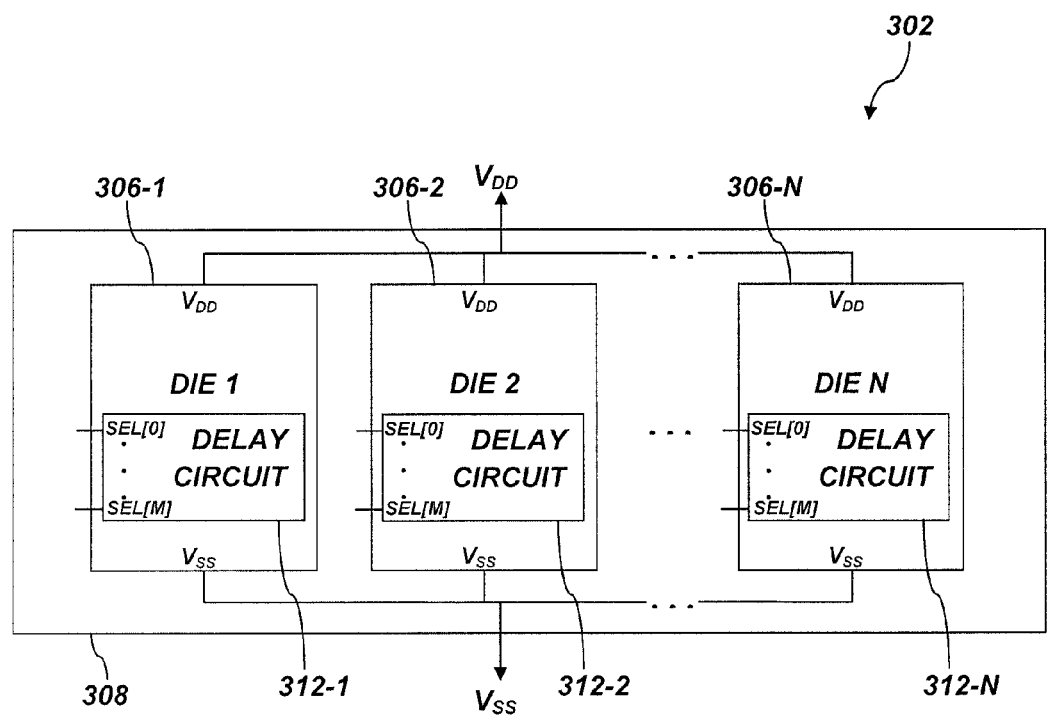
FIG. 3 is a simplified block diagram of an electronic device including a stack of semiconductor dies configured to stagger power-up over time with delay circuits.

FIG. 3 is a simplified block diagram of an electronic device 302 including a stack 104 (FIG. 1) of semiconductor dies 306-1, 306-2, . . . 306-N (sometimes referred to herein generally together as "dies 306" and alone as "die 306"). The electronic device 302 may include the dies 306, and a package 308 similar to the dies 106, and the package 108 of the electronic device 102 of FIGS. 1 and 2. The dies 306 may be arranged in a stack as discussed above. The dies 306 may be coupled to common voltage signals ($V_{DD}$ and $V_{SS}$) that provide power thereto. In addition, each of the dies 306 may include at least one select input SEL[0], . . . SEL[M]. Power-up may be staggered in time between each of the dies 306 depending, at least in part, on a configuration of input signals operably coupled to the at least one select input SEL[0], . . . SEL[M].

Each die 306 may include a delay circuit 312-1, 312-2, . . . 312-N (sometimes referred to herein generally together as "delay circuits 312," and alone as "delay circuit 312"). The delay circuits 312 may be configured to stagger power-up of the dies 306 over time, responsive to a power-up event (e.g., detection of a power-up command signal, detection of power applied to the dies 306, etc.). For example, the first delay circuit 312-1 may be configured to enable the first die 306-1 to begin power up at a first time, the second delay circuit 312-2 may be configured to enable the second die 306-2 to begin power up at a second time, and so on. In some embodiments, the first die 306-1 may begin power-up at the first time, and may still be in the process of powering up when the second die 306-2 begins power-up at the second time. In some embodiments, the first die 306-1 may finish power-up before the second time, when the second die 306-2 begins power-up.

The delay associated with the first delay circuit 312-1 of the first die 306-1 may be different than the delay associated with the second delay circuit 312-2 of the second die 306-2. The delay circuit 312 of each die 306 may be configured to set the delay associated with the delay circuit 312 by decoding the arrangement with which the at least one select input SEL[0], SEL[M] is asserted. In other words, the order in which the dies 306 power up may be set by the arrangement with which the at least one select input SEL[0], . . . SEL[M] is asserted. In some embodiments, the at least one select input SEL[0], . . . SEL[M] may be asserted by selectively coupling the at least one select input SEL[0], . . . SEL[M] to one of $V_{DD}$ and $V_{SS}$ within the package 308. In other embodiments, the at least one select input SEL[0], . . . SEL[M] may be asserted by at least one command signal. Each die 306 may, in some embodiments, include identical circuitry to the other dies 306 in terms of the internal power-up circuitry, but the select input SEL[0], . . . SEL[M] may be coupled differently in terms of the connections made. As the select inputs SEL[0], . . . SEL[M] may control the delay associated with each die 306, the delay for each die 306 may be different for each die 306 based on how the select input SEL[0], . . . SEL[M] is asserted for each die 106.

Figure 4:
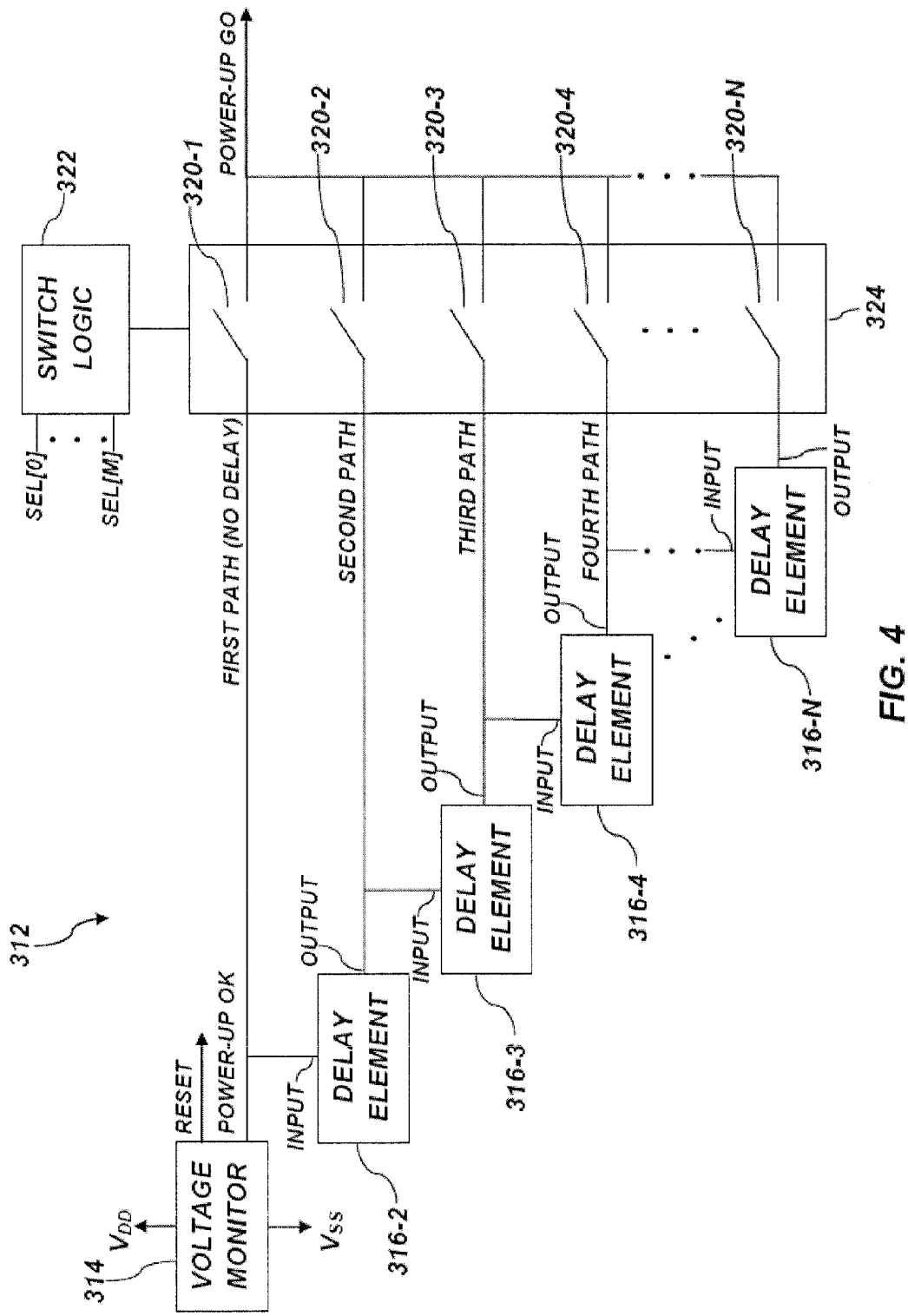
FIG. 4 is a simplified block diagram of a delay circuit of FIG. 3.

FIG. 4 is a simplified block diagram of the delay circuit 312 of FIG. 3. The delay circuit 312 may include a voltage monitor 314, at least one delay element 316-2, . . . 316-N (sometimes referred to herein generally in the plural as "delay elements 316," and in the singular as "delay element 316"), a switch network 324, and a switch logic 322. The delay elements 316 are operably coupled to the switch network 324. The switch logic 322 may be operably coupled to the switch network 324, such that the switch logic 322 controls the operation of the switch network 324 responsive to the arrangement in which the select inputs SEL[0], . . . SEL[M] are asserted. In particular, the switch network 324 may determine which path the POWER-UP OK signal travels to generate the POWER-UP GO signal.

The voltage monitor 314 may be configured to monitor a power supply voltage ($V_{DD}$-$V_{SS}$). The voltage monitor 314 may be configured to output a POWER-UP OK signal if the voltage monitor 314 detects that the magnitude of the power supply voltage is above a predetermined power-up threshold voltage. Consequently, the power-up event for the delay circuit 312 of FIG. 4 is a detection of the magnitude of the power supply voltage being above the predetermined power-up threshold voltage. In some embodiments, the voltage monitor 314 may be replaced with a power-up command operably coupled to the input of the delay element 316-2 and a switch 320-1 of the switch network 324.

The voltage monitor 314 may also be configured to output a RESET signal if the magnitude of the power supply voltage drops below a predetermined reset threshold voltage. The die 306 may be configured to power down responsive to receiving the RESET signal. In some embodiments, the predetermined reset threshold may be approximately a minimum operational voltage of the die 306.

The delay circuit 312 may be configured to generate a POWER-UP GO signal. The die 306 may be configured to power-up if the POWER-UP GO signal is asserted. In some embodiments, the POWER-UP GO signal of at least one die 306 may be operably coupled to the POWER-UP OK signal. The at least one die 306 may, therefore, power up responsive to the voltage monitor 314 asserting the POWER-UP OK signal. Such at least one die 306 may be different from at least another die 306. By way of non-limiting example, in some embodiments the at least one die 306 may not include the delay elements 316, the switch logic 322, and the switch network 324. Also by way of non-limiting example, the at least one die 306 may comprise a controller configured to power up responsive to the voltage monitor 314 asserting the POWER-UP OK signal, and the at least another die 306 may be a memory die. In some embodiments, the POWER-UP OK signal of the voltage monitor 314 may be operably coupled to the POWER-UP GO signal by the switch network 324 and at least one delay element 316, as indicated in FIG. 4.

The switch network 324 may include switches 320-1, 320-2, . . . 320-N (sometimes referred to herein generally together as "switches 320," and individually as "switch 320") configured in an electrically conductive closed state or an electrically isolating open state (sometimes referred to herein simply as "closed," (i.e., enabled) and "open," (i.e., disabled) respectively) responsive to an output signal of the switch logic 322. In some embodiments, the switches 320 may include one or more transistors (e.g., MOSFETs, BJT) with gates operably coupled to the switch logic 322. In some embodiments, the switches 320 may include relays, or other electrically controllable switches.

Each switch 320 may be operably coupled with the voltage monitor 314 to receive the POWER-UP OK signal, and to establish a path for the POWER-UP OK signal to be passed on as the POWER-UP GO signal. For example, a first path may not include a delay element 316, and, if enabled, results in little to no delay. The second path includes delay element 316-2, and, if enabled, results in the delay associated with the delay element 316-2. The third path includes delay element 316-2 and 316-3 coupled in series, and, if enabled, results in the delay associated with the sum of delay element 316-2 and delay element 316-3. Likewise, the fourth path, and each subsequent path include additional delay elements 316-4, . . . 316-N, and, if enabled, result in more delay, as each subsequent path results in the delay of additional delay elements 316-4, . . . 316-N and the delay of previous paths added together.

Enabling each path may be controlled by switch network 324. For example, the first switch 320-1 may operably couple the POWER-UP OK signal of the voltage monitor 314 to the POWER-UP GO signal if the first switch 320-1 is closed. The second switch 320-2 may operably couple an output of a second delay element 316-2 to the POWER-UP GO signal if the second switch 320-2 is closed. Similarly, any subsequent switch 320-3, . . . 320-N may be operably coupled with an output of a corresponding delay element 316-3, 320-N if the subsequent switch 320-3, . . . 320-N is closed, up to an Nth switch 320-N, which may operably coupled an output of an Nth delay element 316-N to the POWER-UP GO signal if the Nth switch 320-N is closed.

Thus, each switch 320 operably couples the POWER-UP OK signal of the voltage monitor 314 to the POWER-UP GO signal of the delay circuit 312 through a number of delay elements 316 varying from zero delay elements 316 (switch 320-1) to N delay elements 316 (switch 320-N). Consequently, the POWER-UP GO signal of the delay circuit 312 may be asserted at the same time as the POWER-UP OK signal of the voltage monitor 314, or at various delayed times after the POWER-UP OK signal of the voltage monitor 314 is asserted, responsive to which switch 320 is closed. The switch 320 that is closed may depend on the configuration with which each at least one select input SEL[0], . . . SEL[M] is operably coupled (e.g., wire bonded) to one of $V_{DD}$ and $V_{SS}$.

The switch logic 322 may be configured to control which switch 320 is closed. The switch logic 322 may include the at least one select input SEL[0], . . . SEL[M]. Referring to FIGS. 3 and 4, $V_{DD}$ and $V_{SS}$ may be selectively operably coupled to the at least one select input SEL[0], . . . SEL[M] within the package 308. The switch logic 322 may be configured to cause one of the switches 320 to close depending upon how $V_{DD}$ and $V_{SS}$ are coupled to the select inputs SEL[0], . . . SEL[M]. In some embodiments, switch commands may be coupled to the at least one select input SEL[0], . . . SEL[M] instead of $V_{DD}$ and $V_{SS}$.

By way of non-limiting example, a package 308 may include a stack 104 (FIG. 1) of two dies 306 including a first die 306-1 and a second die 306-2. Each die 306-1, 306-2 comprises its own a delay circuit 312, switch logic 322, and select input SEL[0]. The switch logic 322 for each of the dies 306-1 and 306-2 is configured to their corresponding control switches 320-1 and 320-2 responsive to select input SEL[0]. The switch logic 322 may be configured to control the switch network 324 of each die 306-1, 306-2 according to the following table:

| Die | SEL[0] | Switch 320-1 | Switch 320-2 |
| --- | --- | --- | --- |
| First Die 306-1 | $V_{DD}$ | Closed | Open |
| Second Die 306-2 | $V_{SS}$ | Open | Closed |

As shown in the table for the two die 306 example, if the select input SEL[0] is coupled to $V_{DD}$, the switch logic 322 may cause switch 320-1 to be closed, and switch 320-2 to be open. Likewise, if the select input SEL[0] is coupled to $V_{SS}$, the switch logic 322 may cause switch 320-1 to be open, and switch 320-2 to be closed. Consequently, power-up may be staggered between a first die 306-1 and a second die 306-2 by coupling the select input SEL[0] of the first die 306-1 to $V_{DD}$, and the select input SEL[0] of the second die 306-2 to $V_{SS}$.

Also by way of non-limiting example, a package 308 may include a stack 104 (FIG. 1) of four dies 306 including a first die 306-1, a second die 306-2, a third die (not shown), and a fourth die (not shown). Each die 306 may include its own delay circuit 312, switch logic 322, and select inputs SEL[0] and SEL[1] (not expressly shown). The switch logic 322 may be configured to control the switch network 324 according to the following table:

| Die | SEL[0] | SEL[1] | First Switch 320-1 | Second Switch 320-2 | Third Switch 320-3 | Fourth Switch 320-4 |
| --- | --- | --- | --- | --- | --- | --- |
| First Die 306-1 | $V_{DD}$ | $V_{DD}$ | Closed | Open | Open | Open |
| Second Die 306-2 | $V_{DD}$ | $V_{SS}$ | Open | Closed | Open | Open |
| Third Die | $V_{SS}$ | $V_{DD}$ | Open | Open | Closed | Open |
| Fourth Die | $V_{SS}$ | $V_{SS}$ | Open | Open | Open | Closed |

As shown in the table for the four die 306 example, power-up may be staggered in time between each of the dies 306, depending on how each select input SEL[0], SEM[1] is coupled to $V_{DD}$ and $V_{SS}$ within the package 308. In other words, even though each delay circuit 312 of each die 306 may include identical circuitry, each die 306 may power up at a different time depending on how each select input SEL[0], SEL[1] is hard-wired (e.g., wire bonded) to $V_{DD}$ and $V_{SS}$. It will be readily apparent to those skilled in the art that an extra select input SEL[M] may be added to increase the number of dies 306 by a factor of 2, assuming that each die 306 powers up at a different time.

In some embodiments, the present disclosure comprises an apparatus including a semiconductor die 306. The semiconductor die 306 comprises a plurality of configurable delay paths, at least one select input SEL[0], . . . SEL[M], and a switch logic 322 coupled to the at least one select input SEL[0], . . . SEL[M] to select one of the plurality of configurable delay paths responsive to a signal configuration at the at least one select input SEL[0], . . . SEL[M]. Each of the delay paths may correspond to a delay of a different duration. The semiconductor die 306 die is configured to detect a power-up event and to power up after the delay of the selected delay path. The at least one select input SEL[0], . . . SEL[M] is coupled to (e.g., wire bonded) one of $V_{DD}$ and $V_{SS}$ to provide the signal configuration. The apparatus may also comprise another semiconductor die 306 comprising a plurality of delay paths, similar to the first semiconductor die 306. The select input SEL[0], . . . SEL[M] of the another semiconductor die 306 is configured to select a delay path that corresponds to another delay that is different from the delay of the selected delay path of the semiconductor die 306.

Figure 5:
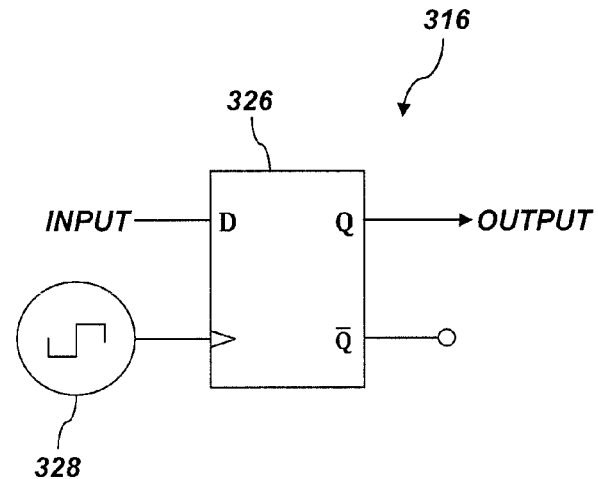
FIGS. 5 through 7 are simplified schematic diagrams of non-limiting examples of a delay element of FIG. 4.

FIG. 5 is a simplified schematic diagram of one of the delay elements 316 of FIG. 4. The delay element 316 may include a flip-flop 326 operably coupled to a clock 328. When the input is asserted, the output of the delay element 316 may not be asserted until the flip-flop 326 detects at least one of a rising edge and a falling edge of the clock 328. In some embodiments, a clock divider (not shown) may be operably coupled between the flip-flop 326 and the clock 328. Also, in some embodiments, the clock 328 may be external to the delay element 316. By way of non-limiting example, the die 306 (FIG. 3) that includes the delay element 316 may include the clock 328 as part of the functional circuit fabricated on or in the die 306. Also by way of non-limiting example, the clock 328 may be external to the package 308 (FIG. 3), and be operably coupled to the dies 306 (FIG. 3) through one or more pin 110 (FIG. 1).

Figure 6:
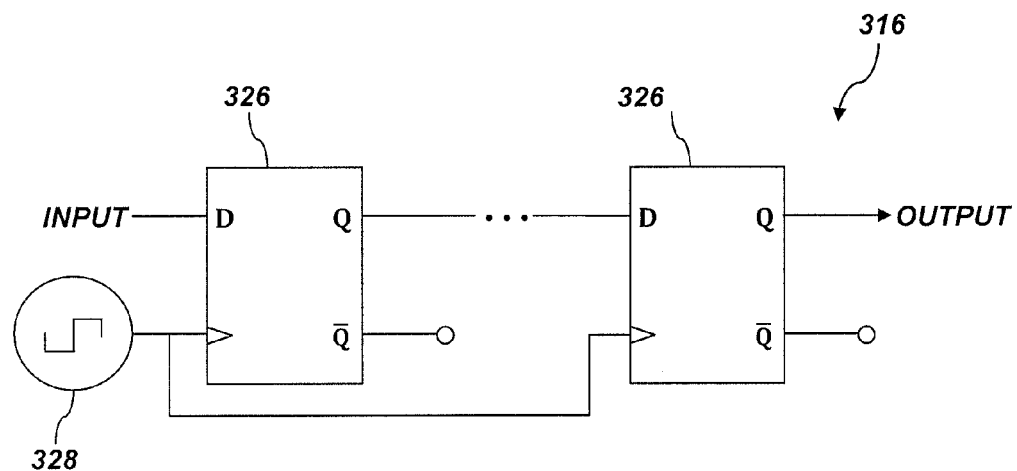

FIG. 6 is a simplified schematic diagram of another non-limiting example of one of the delay elements 316 of FIG. 4. The delay element 316 of FIG. 6 is similar to the delay element 316 of FIG. 5 except that the delay element 316 of FIG. 6 may include a plurality of flip-flops 326 coupled in series. The clock 328 may be operably coupled to each of the flip-flops 326. The output of the delay element 316 may be asserted a number of clock 328 cycles after the input is asserted that corresponds to a number of flip-flops 326.

Figure 7:
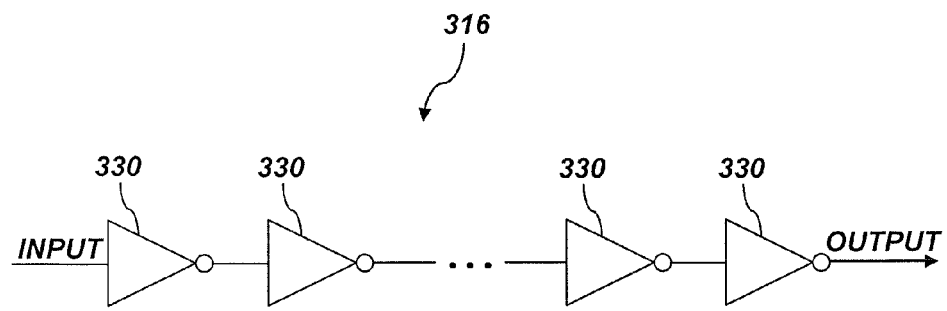

FIG. 7 is a simplified schematic diagram of yet another non-limiting example of one of the delay elements 316 of FIG. 4. The delay element 316 may include one or more inverters 330 operably coupled in series. Of course, any number of inverters 330 are contemplated as being used as delay elements 316. The total delay of the delay element 316 may depend on the number of inverters 330 present in the delay element 316, and may be increased by adding additional inverters 330.

Those of ordinary skill in the art will recognize that FIGS. 5 through 7 depict only a few contemplated implementations of the delay element 316, and that other implementations of the delay element 316 are contemplated and may be practiced without departing from the scope of the present disclosure as would be understood by those of ordinary skill in the art.

Figure 8:
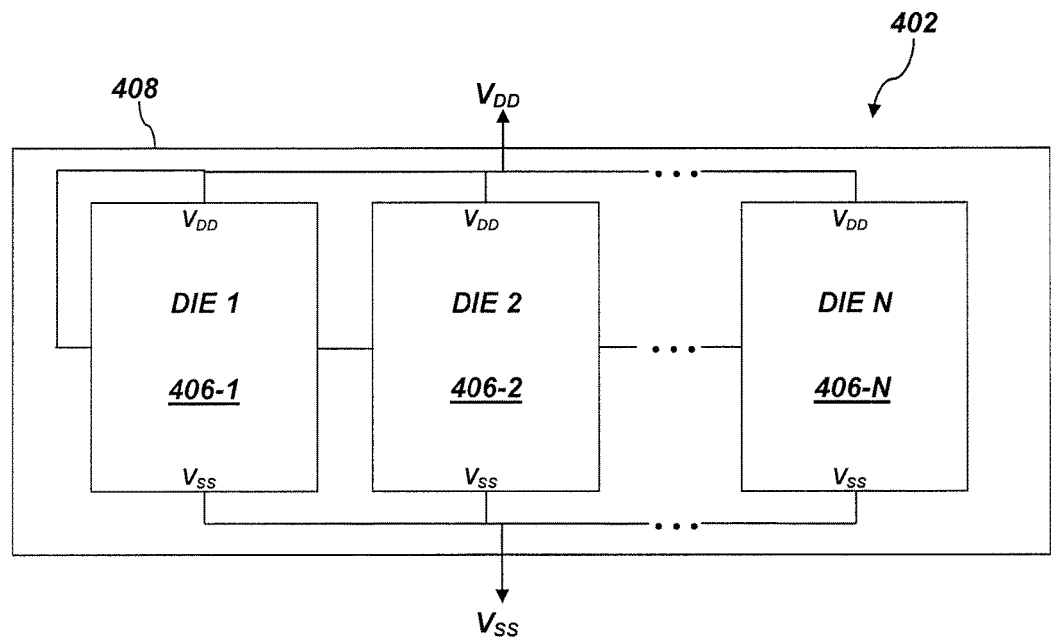
FIG. 8 is a simplified block diagram of another electronic device including a stack of semiconductor dies configured to stagger power-up over time.

FIG. 8 is a simplified block diagram of an electronic device 402 including a stack 104 (FIG. 1) of semiconductor dies 406-1, 406-2, ... 406-N (sometimes referred to herein generally together as "dies 406" and alone as "die 406") configured to stagger power-up over time responsive to a power-up event. The electronic device 402 may include the dies 406, and a package 408 similar to the dies 106, and the package 108, respectively, of the electronic device 102 of FIGS. 1 and 2. The dies 406 may be configured in a stack 104 as discussed with respect to FIG. 1. The dies 406 may be configured to power-up one at a time. A first die 406-1 may power up, and signal to a second die 406-2 when the first die 406-1 is finished powering up. The second die 406-2 may power up, and signal to the next die 406, and so forth, until a last die 406-N powers-up.

Figure 9:
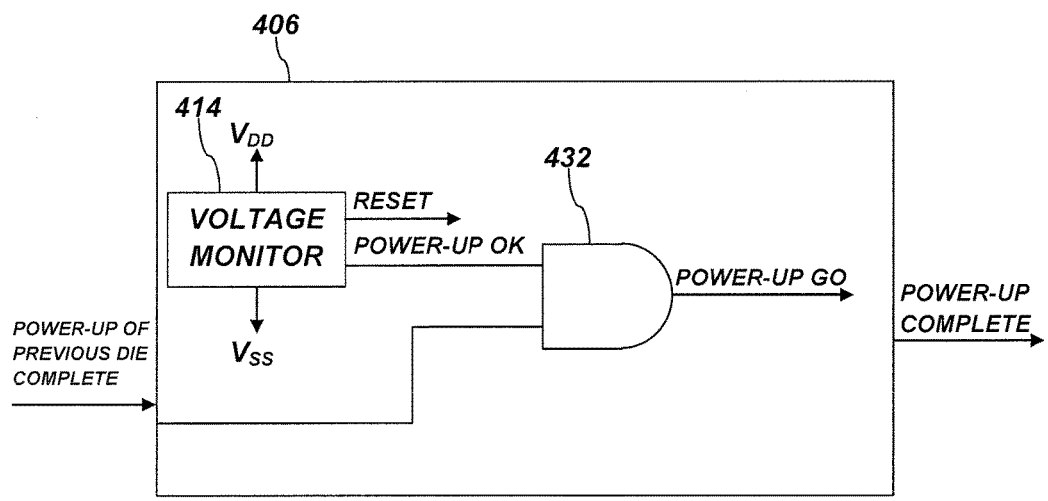
FIG. 9 is a simplified block diagram of a semiconductor die of FIG. 8.

FIG. 9 is a simplified block diagram of a die 406 of FIG. 8. Referring to FIGS. 8 and 9 together, each die 406 may include a voltage monitor 414, an AND gate 432, a POWER-UP OF PREVIOUS DIE COMPLETE input, and a POWER-UP COMPLETE output. The POWER-UP OF PREVIOUS DIE COMPLETE input of the first die 406-1 may be operably coupled to $V_{DD}$, as illustrated in the embodiment of FIG. 8. In such embodiments, the power-up event may be a magnitude of a power supply voltage ($V_{DD}$–$V_{SS}$) rising above a predetermined threshold voltage. In other embodiments, the POWER-UP OF PREVIOUS DIE COMPLETE input of the first die 406-1 may be operably coupled to a power-up command. In such embodiments, the power-up event may be an assertion of the power-up command. The POWER-UP OF PREVIOUS DIE COMPLETE input of each subsequent die 406-2, ... 406-N may be coupled to the POWER-UP COMPLETE output of the previous die 406.

Similar to the voltage monitor 314 of FIG. 4, the voltage monitor 414 may be configured to monitor a magnitude of a power supply voltage ($V_{DD}$–$V_{SS}$). The voltage monitor 414 may be configured to output a POWER-UP OK signal if the voltage monitor 414 detects that the magnitude of the power supply voltage is above a predetermined power-up threshold. The voltage monitor 414 may also be configured to output a RESET signal if the magnitude of the power supply voltage drops below a predetermined reset threshold. If the voltage monitor 414 outputs the RESET signal, the die 406 may be configured to power down. In some embodiments, the predetermined reset threshold may be approximately a minimum operational voltage of the die 406.

The die 406 may include an AND gate 432 with a POWER-UP GO signal at the output. The POWER-UP OK signal and the POWER-UP OF PREVIOUS DIE COMPLETE input may be operably coupled to the inputs of the AND gate 432. The POWER-UP GO signal may be asserted if both the POWER-UP OK signal and the POWER-UP OF PREVIOUS DIE COMPLETE input are asserted. The die 406 may be configured to power-up if the POWER-UP GO signal is asserted.

In some embodiments, a first subset of dies 406 may power up at a first time, and a second subset of dies 406 may power up at a second time. By way of non-limiting example, each of the first subset of dies 406 may be operably coupled to $V_{DD}$ or a power-up command at a POWER-UP OF PREVIOUS DIE COMPLETE input. Also by way of non-limiting example, the POWER-UP COMPLETE output of each of the first subset of dies 406 may be operably coupled to the POWER-UP OF PREVIOUS DIE COMPLETE inputs of each of the second subset of dies 406 by an AND gate. Furthermore, coupling the POWER-UP COMPLETE output of a die 406 to the POWER-UP OF PREVIOUS DIE COMPLETE inputs of more than one die 406 is contemplated. In addition, connecting the POWER-UP COMPLETE output of more than one die 406 to a single die 406 through an AND gate is contemplated.

Figure 10:
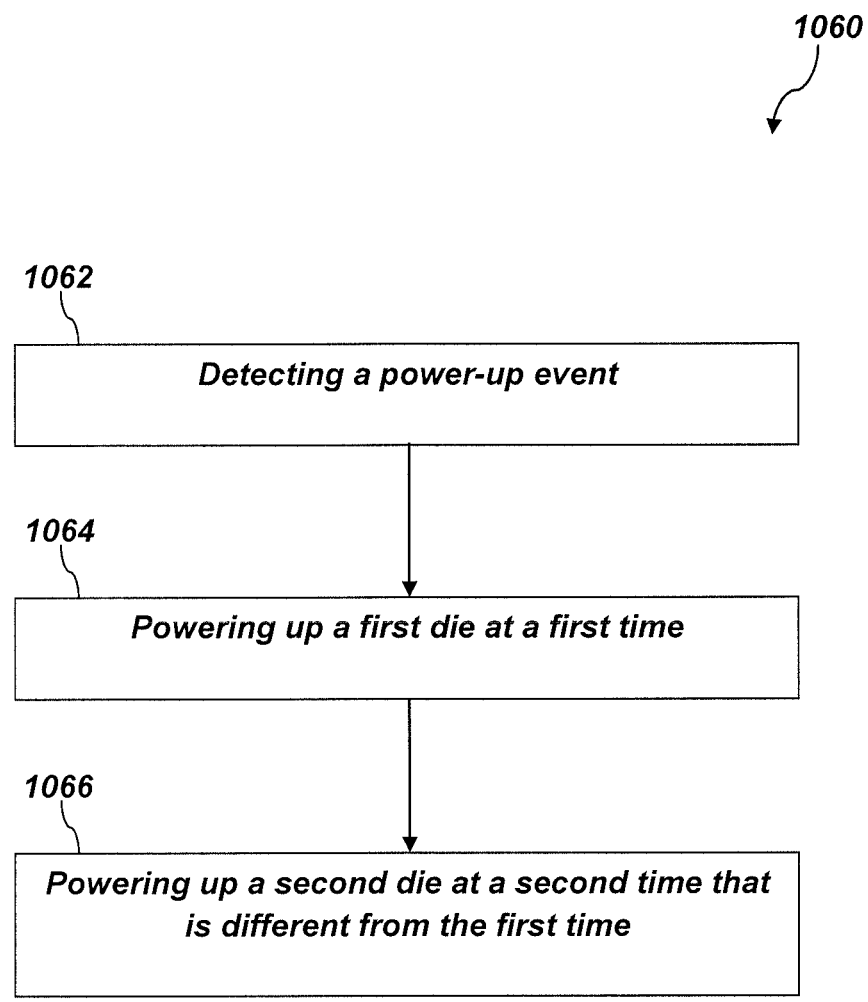
FIG. 10 is a simplified flowchart of a method illustrating power-up of the electronic device of FIGS. 3 and 8.

FIG. 10 is a simplified flowchart 1060 illustrating a method of powering up the electronic devices 302, 402 of FIGS. 3 and 8. At operation 1062, each die 306, 406 may detect a power-up event. In some embodiments, detecting the power-up event may comprise each die 306, 406 detecting a magnitude of a power supply voltage rising above a predetermined power-up threshold voltage. In some embodiments, detecting the power-up event may comprise each die 306, 406 detecting a power-up command.

At operation 1064, a first die 306-1, 406-1 may power up at a first time. In some embodiments, the first die 306-1, 406-1 may power up at substantially the same time as the detection of the power-up event. In some embodiments, there may be a delay between when the power-up event is detected and the first die 306-1, 406-1 powers up.

At operation 1066, a second die 306-2, 406-2 may power up at a second time that is different from the first time. Thus, the first die 306-1, 406-1 and the second die 306-2, 406-2 may be powered up according to a staggered arrangement. In some embodiments, the second die 306-2, 406-2 may include a delay circuit 312 comprising one or more delay elements 316 and a switch network 324 to set the delay between the first time and the second time. The switch network 324 may be controllable by at least one select input SEL[0], ... SEL[M]. In some embodiments, the first die 306-1, 406-1 may power-up at the first time, and send a signal to the second die 306-2, 406-2 at the second time indicating that the first die 406-1 has completed power-up. The second die 406-2 may power up at the second time responsive to receiving the signal from the first die 406-1.

In some embodiments, power-up of the first die 306-1 and the second die 306-2 may at least partially overlap (e.g., the second die 306-2 begins to power up according to some delay, but still while the first die 306-1 is powering up). In some embodiments, power-up of the first die 306-1, 406-1 and the second die 306-2, 406-2 may not overlap (e.g., the first die 306-1, 406-1 powers up completely, after which the second die 306-2, 406-2 begins to power up). Thus, the first die 306-1, 406-1 and the second die 306-2, 406-2 may each experience a staggered power up responsive to the power-up event.

The method may continue, for example, if there are more than two dies 306, 406 in the package 308, 408. By way of non-limiting example, another die 306, 406 may power up at another time that is different from the first time and the second time, and so on.

In some embodiments, staggered power-up of the dies 306, 406 may comprise powering up a first subset of the dies 306, 406 at a first time, and powering up a second subset of the dies 306, 406 at a second time. A subset may be a plurality of dies 306, 406 that power up at substantially the same time. By way of non-limiting example, in the embodiment of FIG. 3, more than one die 306 may be configured such that the same switch 320 is closed in the more than one die 306.

Also, in some embodiments, the period of time between dies 306, 406 or subgroups of dies 306, 406 being powered up may be equal. In some embodiments, however, the period of time between dies 306, 406 or subgroups of dies 306, 406 being powered up may vary.

In some embodiments, principles from the electronic device 302 of FIGS. 3 through 7 may be combined with principles of the electronic device 402 of FIGS. 8 and 9. By way of non-limiting example, a flip-flop 326 of FIG. 5 may be clocked with a POWER-UP COMPLETE output of a die 406 of FIG. 9, resulting in a delay of the delay element 316 (FIG. 4) to be approximately the amount of time a die 306 takes to power-up.

In some embodiments, the present disclosure comprises a method of powering up an electronic device 102 (FIGS. 1 and 2), 302, 402. The method comprises detecting a power-up event with semiconductor dies 106, 306, 406 in a stack 104 (FIG. 1). The plurality of semiconductor dies 106, 306, 406 may be arranged in a stack 104 of semiconductor dies 106, 306, 406 within a common package 108, 308, 408. The method also comprises staggering power-up of each semiconductor die 106, 306, 406 in the stack 104 over time responsive to detecting the power-up event. For example, the method may include initiating power-up of a first semiconductor die 106-1, 306-1, 406-1 of the stack 104 of semiconductor dies 106, 306, 406 at a first time, and initiating power-up of a second semiconductor die 106-2, 306-2, 406-2 of the stack 104 of semiconductor dies 106, 306, 406 at a second time that is different from the first time.

Figure 11:
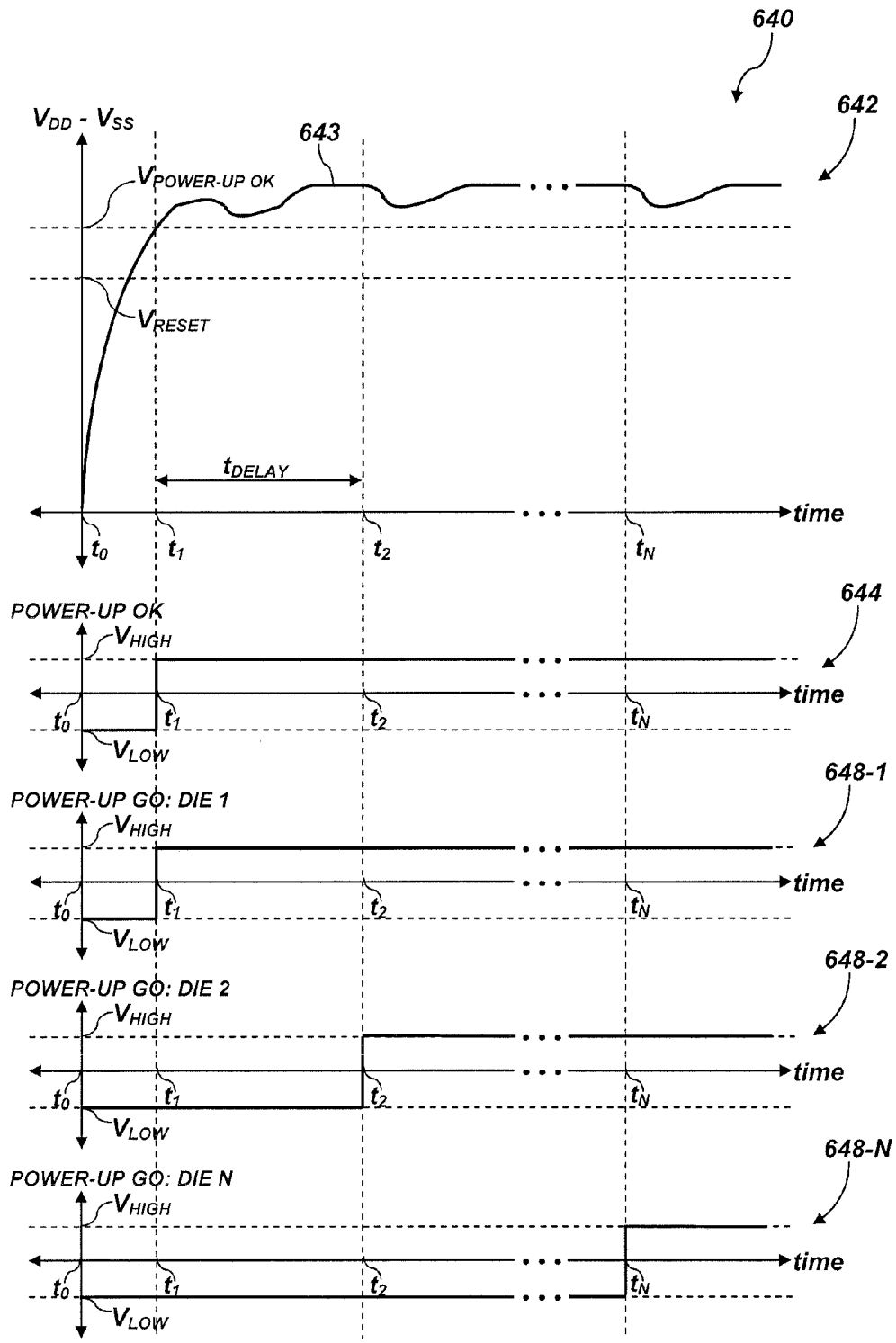
FIGS. 11 and 12 are examples of simplified timing diagrams for the electronic device of FIG. 3.
Figure 12:
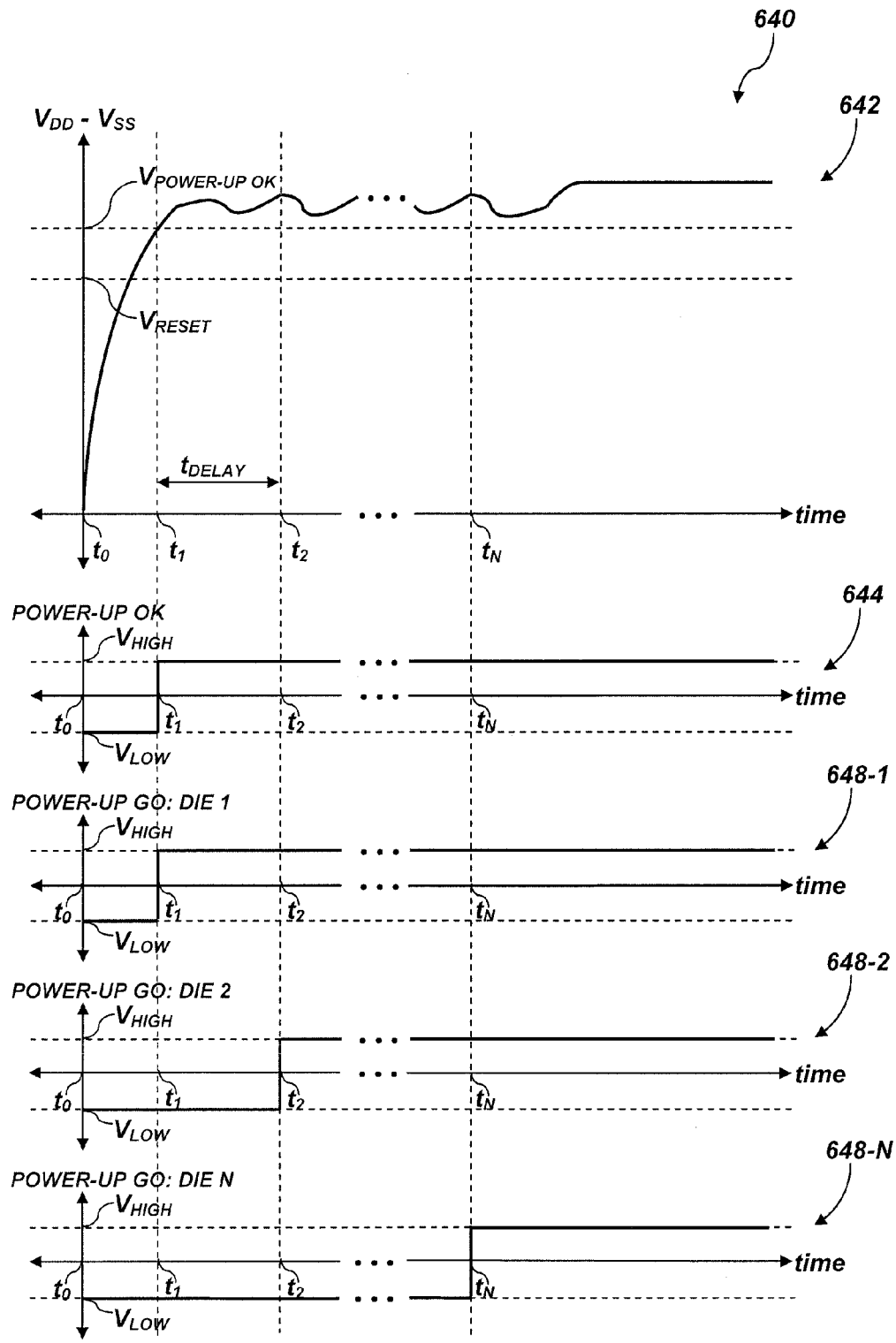

FIGS. 11 and 12 are non-limiting examples of simplified timing diagrams 640 for the electronic device 302 of FIG. 3. Referring to FIGS. 3, 4, and 11 together, FIG. 11 corresponds to a simplified timing diagram 640 that may result from an electronic device 302 where each delay element 316 imposes a delay $t_{DELAY}$ that is longer than a time required for each die 306 to power-up. The simplified timing diagram 640 may include a plot 642 of a magnitude of a power supply voltage ($V_{DD}$–$V_{SS}$), a plot 644 of a POWER-UP OK signal of the voltage monitor 314 of each die 306, and a plot 648-1, 648-2, ... 648-N of a POWER-UP GO signal for each die 306-1, 306-2, ... 306-N, respectively. Each plot 642, 644, 648-1, 648-2, ... 648-N is plotted with respect to time.

Select inputs SEL[0], ... SEL[M] of the first die 306-1 may be asserted such that a first switch 320-1 is closed, operably coupling the POWER-UP OK signal of the voltage monitor 314 of the first die 306-1 to the POWER-UP GO signal without any delay elements 316 in between. Also, select inputs SEL[0], ... SEL[M] of the second die 306-2 may be asserted such that a second switch 320-2 is closed, operably coupling the POWER-UP OK signal of the voltage monitor 314 of the second die 306-2 to the POWER-UP GO signal through one delay element 316. Similarly, select inputs SEL[0], ... SEL[M] of the Nth die 306-N may be asserted such that an Nth switch 320-N is closed, operably coupling the POWER-UP OK signal of the voltage monitor 314 of the Nth die 306-N to the POWER-UP GO signal through Nth delay elements 316-N.

At time $t_0$, power may be initiated at the power supply. The magnitude of the power supply voltage may increase, and reach the predetermined power-up threshold voltage $V_{POWER-UP\ OK}$ at time $t_1$, as shown in plot 642. The voltage monitor 314 of each die 306 may assert the POWER-UP OK signal at time $t_1$ responsive to the magnitude of the power supply voltage reaching the predetermined power-up threshold voltage $V_{POWER-UP\ GO}$, as shown in plot 644. As the POWER-UP OK signal of the first die 306-1 is operably coupling to the POWER-UP GO signal of the first die 306-1 without any delay elements 316 in between, The POWER-UP GO signal of the first die 306-1 may also be asserted at time $t_1$, as shown in plot 648-1.

As the POWER-UP GO signal of the first die 306-1 is asserted at time $t_1$, the first die 306-1 may power-up starting at time $t_1$. The magnitude of the power supply voltage may drop a relatively small amount (compared to a voltage drop that may result from all the dies 306 powering up at once) after time $t_1$ due to a power-up voltage transient resulting from current drawn by the first die 306-1 during power-up, as shown in plot 642. If all the dies 306 powered up at the same time, the magnitude of the power supply voltage may drop below the predetermined reset voltage $V_{RESET}$, and the dies 306 may enter a repeating cycle of attempted power-up and power-down. After the first die 306-1 finishes powering up, the magnitude of the power supply voltage may settle to a steady state value, as shown by a flat region 643 of the plot 642 before time $t_2$.

Once time $t_{DELAY}$ has passed after time $t_1$, delay element 316-2 may assert the POWER-UP GO signal of the second die 306-2 at time $t_2$, as shown in plot 648-2. The second die 306-2 may power up starting at time $t_2$. The magnitude of the power supply voltage may drop a relatively small amount after time $t_2$ due to a power-up voltage transient resulting from current drawn by the second die 306-2, and settle to the steady state value, similar to the flat region 643.

Power-up of the dies 306 may continue at intervals of time $t_{DELAY}$ after each previous die 306 starts power-up until time $t_N$, when the delay element 316-N asserts the POWER-UP GO signal of the Nth die 306-N. The Nth die 306-N may power up starting at time $t_N$, as shown in plot 648-N. The magnitude of the power supply voltage may drop a relatively small amount after time $t_N$ due to a power-up voltage transient resulting from current drawn by the Nth die 306-N, and settle to the steady state value, as shown in plot 642 after time $t_N$.

As shown in plot 642, the relatively small drop in the magnitude of the power supply voltage following each time $t_1$, $t_2$, ... $t_N$ may be sufficiently small to prevent the magnitude of the power supply voltage from dropping below the reset threshold $V_{RESET}$. Such results may be obtained where each delay element 316 imposes a delay $t_{DELAY}$ that is greater than the amount of time required to power-up a die 306. In some embodiments, such results may also be obtained where each delay element 316 imposes a delay $t_{DELAY}$ that is equal to or less than the amount of time required to power-up a die 306.

Referring to FIGS. 3, 4, and 12 together, FIG. 12 may be similar to FIG. 11, except that each delay element 316 may impose a delay $t_{DELAY}$ that is shorter than a time required for each die 306 to power-up. In other words, power-up of at least two dies 306 may at least partially overlap even though the starting time for power up of the at least two dies 306 was different. As a result, the magnitude of the power supply voltage may not arrive at a steady state until after the Nth die 306-N powers-up, as shown in plot 642 of FIG. 12.

Figure 13:
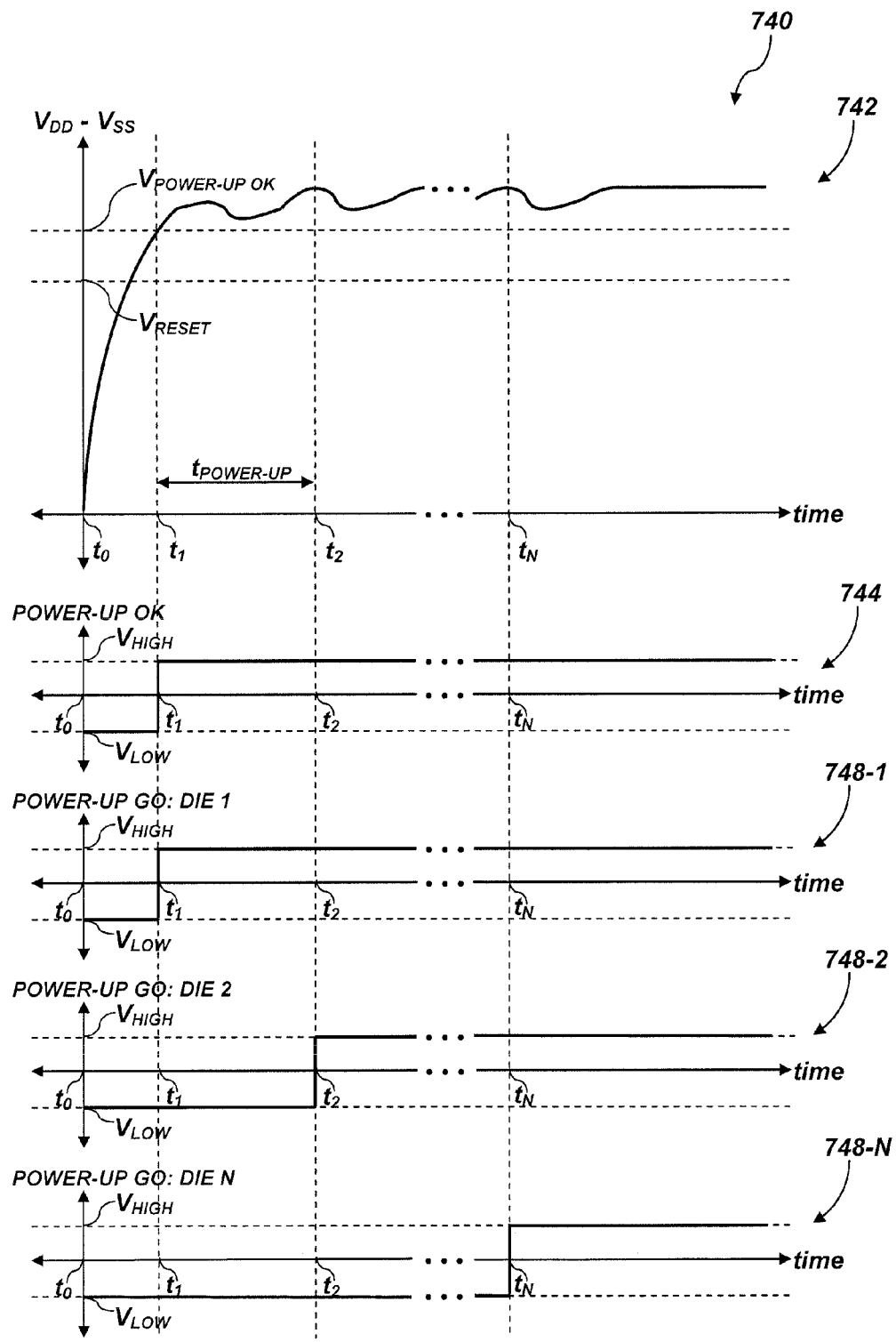
FIG. 13 is an example of a simplified timing diagram for the electronic device of FIG. 8.

FIG. 13 is a simplified timing diagram 740 for the electronic device 402 of FIG. 8. Referring to FIGS. 8, 9, and 13 together, FIG. 13 corresponds to a simplified timing diagram 740 that may result from an electronic device 402. The timing diagram 740 may be similar to the timing diagrams 640 of FIGS. 11 and 12 except that a time between dies 406 powering-up is approximately equal to a time required for a die 406 to power up $t_{POWER-UP}$, as shown in plot 742. The timing diagram 740 may include plots 744, 748-1, 748-2, and 748-N, similar to plots 644, 648-1, 648-2, and 648-N of FIGS. 11 and 12. A timing diagram 640 (FIGS. 11 and 12) resulting from the electronic device 302 of FIGS. 3 and 4 may be the same as the timing diagram 740 of FIG. 13 if the delay imposed by each delay element 316 (FIG. 4) is about equal to the time required for a die 306 to power-up.

Figure 14:
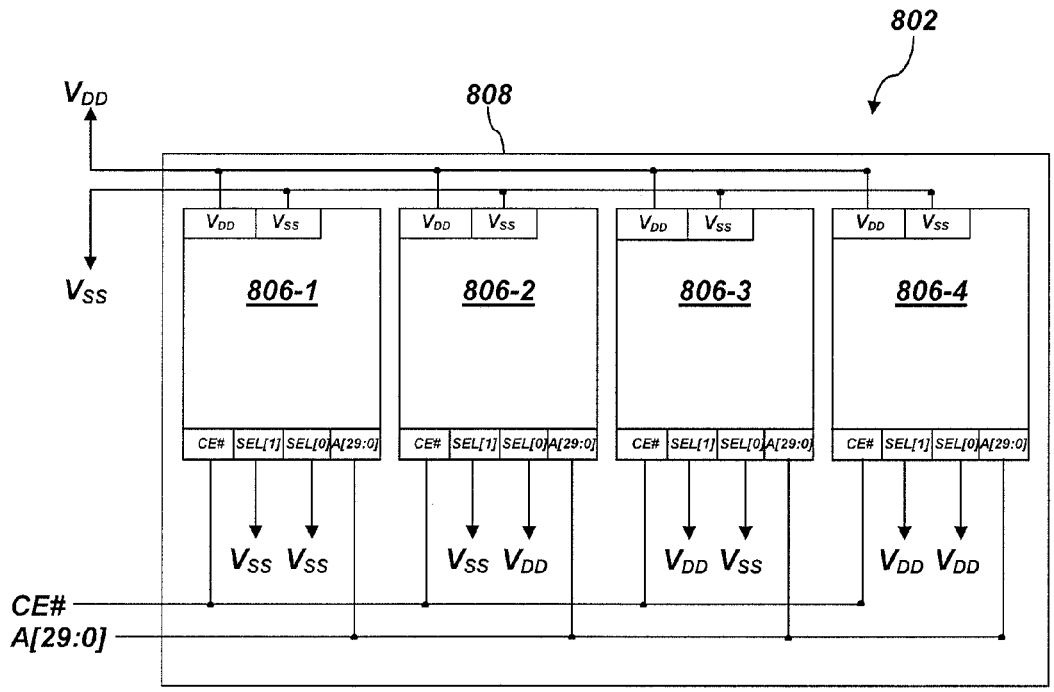
FIG. 14 is a simplified block diagram of an example implementation of the electronic device of FIG. 3.

FIG. 14 is a simplified block diagram of the electronic device 302 of FIG. 3 according to another embodiment of the present disclosure. The electronic device 302 may be a four memory die 806-1 through 806-4 (sometimes referred to herein generally together as "memory dies 806," and alone as "memory die 806") memory device 802. The memory device 802 may include any number of memory dies 806 comprising any number of Gbits of memory. By way of non-limiting example, the embodiment of FIG. 14 comprises four 4 gigabit (Gbit) memory dies 806, totaling 16 Gbit for the memory device 802. In another embodiment, the memory device 802 may comprise six 2 Gbit memory dies 806, totaling 12 Gbits. Power-up of the memory dies 806 may be configured to be staggered over time, as discussed above with respect to FIGS. 3 through 7.

The memory device 802 may be a virtual chip select memory device configured for selecting multiple memory dies 806 with a single chip enable pin CE# of package 808. The chip enable pin CE# may be operably coupled to a chip enable input CE# of each memory die 806. The memory device 802 may include address pins A[29:0] operably coupled to address inputs A[29:0] of each memory die 806. A portion of the address pins A[29:0] may be in addition to the number of address pins used to address bits within the memory die 806. By way of non-limiting example, the lower order address pins A[27:0] may be reserved for memory addresses of the memory die 806, while higher order address pins A[29:28] may be reserved for selecting which memory die 806 should be active.

The memory device 802 may comprise common power supply voltages $V_{DD}$ and $V_{SS}$ operably coupled to power inputs $V_{DD}$ and $V_{SS}$ of the memory dies 806 through a set of electrically conductive power pins extending from the package 808. The power supply voltages $V_{DD}$ and $V_{SS}$ may also be selectively operably coupled to select inputs SEL[0] and SEL[1] of each memory die 806. For example, both the SEL[0] and SEL[1] inputs of memory die 806-1, the SEL[1] input of memory die 806-2, and the SEL[0] input of memory die 806-3 are coupled to $V_{SS}$ in FIG. 14. Also, the SEL[0] input of memory die 806-2, the SEL[1] input of memory die 806-3, and both select inputs SEL[0] and SEL[1] of memory die 806-4 are coupled to $V_{DD}$.

In addition to determining an order in which the memory dies 806 will power up responsive to a power-up event, as discussed with reference to FIGS. 3 through 7, the configuration of the select inputs SEL[0] and SEL[1] may also determine, in conjunction with the address inputs A[29:28], which memory die 806 should be active. The term "active" refers to an operational state of a memory die 806 (e.g., reading and writing to the memory die 806 is enabled), as contrasted with a power-up state. For example, when the address inputs A[29:28] match the select inputs SEL[0] and SEL[1] of a given memory die 806, the given memory die 806 may be active. The following table illustrates selection of an active memory die 806:

| | | Memory Die States: | | | |
|---|---|---|---|---|---|
| CE# | A[29:28] | Die 806-1 SEL[1:0] = 00 | Die 806-2 SEL[1:0] = 01 | Die 806-3 SEL[1:0] = 10 | Die 806-4 SEL[1:0] = 11 |
| 1 | X | Standby | Standby | Standby | Standby |
| 0 | 00 | Active | Standby | Standby | Standby |
| 0 | 01 | Standby | Standby | Standby | Standby |
| 0 | 10 | Standby | Standby | Standby | Standby |
| 0 | 11 | Standby | Standby | Standby | Standby |
| 0 | 00 | Standby | Standby | Standby | Standby |
| 0 | 01 | Standby | Active | Standby | Standby |
| 0 | 10 | Standby | Standby | Standby | Standby |
| 0 | 11 | Standby | Standby | Standby | Standby |
| 0 | 00 | Standby | Standby | Standby | Standby |
| 0 | 01 | Standby | Standby | Standby | Standby |
| 0 | 10 | Standby | Standby | Active | Standby |
| 0 | 11 | Standby | Standby | Standby | Standby |
| 0 | 00 | Standby | Standby | Standby | Standby |
| 0 | 01 | Standby | Standby | Standby | Standby |
| 0 | 10 | Standby | Standby | Standby | Standby |
| 0 | 11 | Standby | Standby | Standby | Active |

As shown in the table, when the address pins A[29:28] are asserted as "00," memory die 806-1 may be active. Also, when the address pins A[29:28] are asserted as "01," memory die 806-2 may be active. In addition, when the address pins A[29:28] are asserted as "10," memory die 806-3 may be active. Furthermore, when address pins A[29:28] are asserted as "11," memory die 806-4 may be active.

In operation, only one memory die 806 may be active at any given time. As a result, the address inputs A[29:0] of each memory die 806 may be coupled to the same set of address pins A[29:0]. The memory device 806, therefore, may appear and operate similarly to a single memory die 806 device.

It will be apparent to those of ordinary skill in the art that additional memory dies 806 may be added to the package 808, but would require additional select inputs SEL[M] and address pins A[M]. For example, for every two additional memory dies 806, one more select input SEL[M] and address pin A[M] would be required. It will also be apparent to those of ordinary skill in the art that fewer memory dies 806 may be included in the package 808, and fewer select inputs SEL[M] and address pins A[M] may be required.

Figure 15:
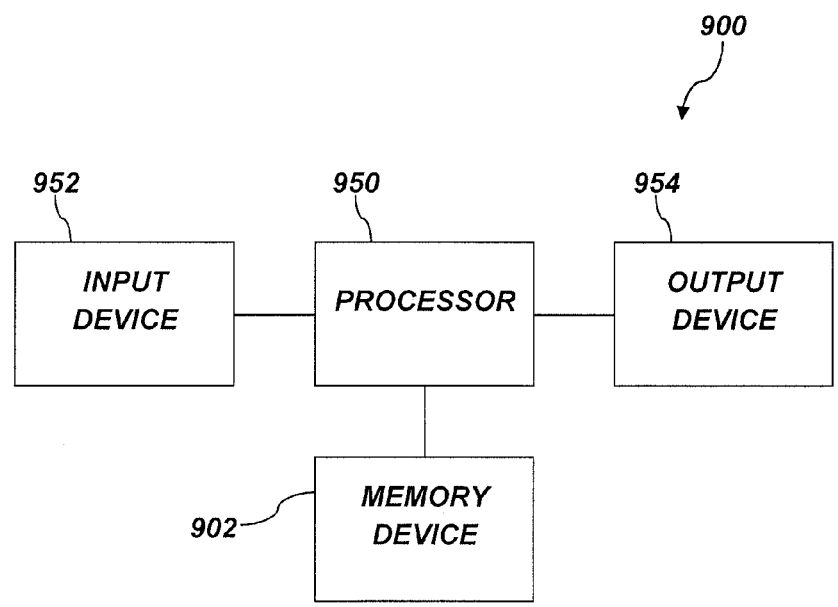
FIG. 15 is a simplified block diagram of an electronic system.

FIG. 15 is a simplified block diagram of an electronic system 900. The electronic system 900 may include a processor 950 operably coupled to a memory device 902, an input device 952, and an output device 954. The processor 950 may be a computing device configured for executing machine-readable commands. In some embodiments, the processor 950 may be an electronic device 102 (FIG. 1) including a package 108 (FIG. 1) housing a stack 104 (FIG. 1) of dies 106 (FIG. 1) configured for temporally staggered power-up.

In some embodiments, the memory device 902 may comprise an electronic device 102, 302, 402, 802 (FIGS. 1, 3, 8, and 14), including a stack 104 (FIG. 1) of dies 106, 306, 406, 806 (FIGS. 1, 3, 8, and 14) configured for temporally staggered power-up, according to any of the embodiments previously discussed herein. By way of non-limiting example, the memory device 902 may be a random access memory (RAM) device, a read only memory (ROM) device, a Flash memory device, other suitable memory device, and combinations thereof. The memory device 902 may be implemented with any of NOR technology, NAND technology, and other suitable technologies.

The input device 952 may include a keyboard, a mouse, a trackpad, a microphone, and combinations thereof. The output device 954 may include an electronic display, an audio speaker, and combinations thereof. The electronic display may be a cathode ray tube (CRT), a liquid crystal display (LCD), a light emitting diode (LED) array, a plasma display, other suitable electronic display, and combinations thereof.

In some embodiments, the present disclosure comprises an electronic system 900 including at least one stack 104 (FIG. 1) comprising a plurality of semiconductor dies 106, 306, 406 (FIGS. 1, 2, 3, and 8). The plurality of semiconductor dies 106, 306, 406 of the at least one stack 104 are configured to power-up in a staggered manner over time responsive to a power-up event.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of embodiments encompassed by the disclosure as contemplated by the inventors.

What is claimed is:

1. An apparatus, comprising:
a first semiconductor die including at least one first power input and a first voltage monitor; and
a second semiconductor die including at least one second power input and a second voltage monitor, wherein:
the first semiconductor die and the second semiconductor die form a stack;
the first voltage monitor is configured to generate a first power-up ok signal responsive to a power-up event detected based on a power supply voltage;
the first semiconductor die is configured to power up at a first time responsive to a first power-up go signal generated when both the first power-up ok signal and the at least one first power input are asserted;
the first semiconductor die is further configured to output a first output signal to the at least one second power input of the second semiconductor die responsive to the first die completing power up;
the second voltage monitor is configured to generate a second power-up ok signal responsive to the power-up event based on the power supply voltage;
the second semiconductor die is configured to power up at a second time responsive to a second power-up go signal generated when both the second power-up ok signal and the at least one second power input are asserted,
wherein the first voltage monitor is configured to:
detect the power-up event by monitoring a power supply voltage and detecting the power supply voltage to have a magnitude above a predetermined threshold; and
generate a reset signal responsive to detecting the magnitude of the power supply voltage to drop below a predetermined reset threshold, and wherein the first semiconductor die is configured to power down responsive to the reset signal.

2. The apparatus of claim 1, wherein a second input signal is the first output signal from the first semiconductor die.

3. The apparatus of claim 1, further comprising a memory device including the stack including the first semiconductor die and the second semiconductor die.

4. The apparatus of claim 3, wherein the memory device is a virtual chip enable memory device.

5. The apparatus of claim 3, further comprising:
a processor;
an input device; and
an output device, wherein the processor is operably coupled to the memory device, the input device, and the output device.

6. The apparatus of claim 1, wherein the second voltage monitor is configured to detect the power-up event by monitoring a power supply voltage and detecting the power supply voltage to have a magnitude above a predetermined threshold.

7. The apparatus of claim 1 wherein the predetermined reset threshold is approximately a minimum operational voltage of the first semiconductor die.

8. An apparatus comprising:
a first semiconductor die including at least one first power input; and
a second semiconductor die including at least a second power input operably coupled to the at least one first power input, wherein the first semiconductor die and the second semiconductor die form a stack, wherein, responsive to a power-up event, the first semiconductor die is configured to power up at a first time, and the second semiconductor die is configured to power up at a second time that is different from the first time,
wherein:
the first semiconductor die is configured to power up responsive to the power-up event;
the first semiconductor die is further configured to output a first output signal to the second semiconductor die responsive to the first die completing power up;

the second semiconductor die is configured to power up responsive to receiving the first output signal from the first semiconductor die;

the first semiconductor die includes a first voltage monitor configured to generate a first power-up ok signal responsive to the power-up event, wherein the first semiconductor die is configured to power up when both the first power-up ok signal and a first input signal are asserted;

the second semiconductor die includes a second voltage monitor configured to generate a second power-up ok signal responsive to the power-up event, wherein the second semiconductor die is configured to power up when both the second power-up ok signal and a second input signal are asserted;

the first semiconductor die further includes a first AND gate operably coupled with the first voltage monitor, the first AND gate configured to generate a first power-up go signal to initiate power up of the first semiconductor die when both the first power-up ok signal and a first input signal are asserted; and the second semiconductor die further includes a second AND gate operably coupled with the second voltage monitor, the second AND gate configured to generate a second power-up go signal to initiate power up of the second semiconductor die when both the second power-up ok signal and a second input signal are asserted.

9. A method of powering up an electronic device, the method comprising:

detecting a power-up event with a plurality of semiconductor dies in a stack of semiconductor dies within a common package;

generating a power-up ok signal responsive to detecting the power-up event;

powering up a first semiconductor die of the stack of semiconductor dies at a first time responsive to the power-up ok signal being asserted;

powering up a second semiconductor die of the stack of semiconductor dies at a second time that is different from the first time responsive to receiving a first output signal from the first semiconductor die indicating that the first semiconductor die has finished powering up, and responsive to both the power-up ok signal and the first output signal from the first semiconductor die being asserted; and receiving, at an AND gate for the second semiconductor die, the power-up ok signal and the first output signal to generate a power-up go signal to initiate power up of the second semiconductor die.

10. The method of claim 9, wherein generating the power-up ok signal is responsive to a first voltage monitor of the first semiconductor die detecting the power-up event, the method further comprising the second semiconductor die generating another power-up ok signal responsive to a second voltage monitor of the second semiconductor die detecting the power-up event.

11. The method of claim 10, wherein:

generating the power-up ok signal for the first semiconductor die is responsive to the first voltage monitor detecting the power-up event by detecting a magnitude of the power supply voltage at the first semiconductor die being above a predetermined threshold; and generating another power-up ok signal as the power-up ok signal for the second semiconductor die is responsive to detecting the power-up event by detecting the magnitude of the power supply voltage at the second semiconductor die being above the predetermined threshold.

12. The method of claim 9, further comprising:

generating a reset signal responsive to detecting a lack of the power-up event; and powering down the first semiconductor die and the second semiconductor die responsive to the reset signal.

13. The method of claim 12, wherein generating a reset signal responsive to detecting a lack of the power-up event includes detecting the magnitude of a power supply signal voltage dropping below a predetermined reset threshold voltage.

14. An apparatus of comprising:

a first semiconductor die including at least one first power input and a first voltage monitor;

a second semiconductor die including at least one second power input and a second voltage monitor, wherein:

the first semiconductor die and the second semiconductor die form a stack;

the first voltage monitor is configured to generate a first power-up ok signal responsive to a power-up event detected based on a power supply voltage;

the first semiconductor die is configured to power up at a first time responsive to a first power-up go signal generated when both the first power-up ok signal and the at least one first power input are asserted;

the first semiconductor die is further configured to output a first output signal to the at least one second power input of the second semiconductor die responsive to the first die completing power up;

the second voltage monitor is configured to generate a second power-up ok signal responsive to the power-up event based on the power supply voltage;

the second semiconductor die is configured to power up at a second time responsive to a second power-up go signal generated when both the second power-up ok signal and the at least one second power input are asserted; and a first AND gate configured to receive the first power-up ok signal and the at least one first power input and output the first power-up go signal; and a second AND gate configured to receive the second power-up ok signal and the at least one second power input and output the second power-up go signal.

* * * * *

UNITED STATES PATENT AND TRADEMARK OFFICE
CERTIFICATE OF CORRECTION

PATENT NO.         : 9,785,171 B2
APPLICATION NO.    : 15/086763
DATED              : October 10, 2017
INVENTOR(S)        : Trismardawi Tanadi Page 1 of 1

It is certified that error appears in the above-identified patent and that said Letters Patent is hereby corrected as shown below:

In the Specification
    Column 7,    Line 30,    change "SEL[0], SEL[M]"
                                                     to --SEL[0], . . . SEL[M]--
    Column 9,    Line 3,    change "316-3, 320-N" to --316-3, . . . 320-N--
    Column 10,    Lines 14-15,    change "SEM[1] is coupled"
                                                     to --SEL[1] is coupled--
    Column 11,    Line 57,    change "a predetei mined power-up"
                                                   to --a predetermined power-up--

In the Claims
Claim 7,    Column 18,    Line 47,    change "claim 1 wherein" to --claim 1, wherein--
Claim 14,    Column 20,    Line 23,    change "An apparatus of comprising:"
                                                 to --An apparatus comprising:--

Signed and Sealed this
Twenty-sixth Day of December, 2017

Joseph Matal
*Performing the Functions and Duties of the
Under Secretary of Commerce for Intellectual Property and
Director of the United States Patent and Trademark Office*